United States Patent
Schmidt et al.

(10) Patent No.: US 6,647,088 B1
(45) Date of Patent: Nov. 11, 2003

(54) PRODUCTION OF A DENSE MIST OF MICROMETRIC DROPLETS IN PARTICULAR FOR EXTREME UV LITHOGRAPHY

(75) Inventors: Martin Schmidt, Vanves (FR); Olivier Sublemontier, Fontenay-Aux-Roses (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 10/089,098

(22) PCT Filed: Oct. 17, 2000

(86) PCT No.: PCT/FR00/02890

§ 371 (c)(1),
(2), (4) Date: Apr. 12, 2002

(87) PCT Pub. No.: WO01/30122

PCT Pub. Date: Apr. 26, 2001

(30) Foreign Application Priority Data

Oct. 18, 1999 (FR) .............................................. 99 12949

(51) Int. Cl.⁷ .............................. G21K 5/00; H01J 35/00
(52) U.S. Cl. ...................... 378/34; 378/119; 378/143; 239/136
(58) Field of Search .................... 378/34, 119, 143; 239/136, 337, 338, 340, 373

(56) References Cited

U.S. PATENT DOCUMENTS

| | | | |
|---|---|---|---|
| 4,723,262 A | 2/1988 | Noda et al. ................. 378/119 |
| 5,577,091 A * | 11/1996 | Richardson et al. ......... 378/119 |
| 5,991,360 A * | 11/1999 | Matsui et al. ................ 378/119 |
| 6,002,744 A * | 12/1999 | Hertz et al. .................. 378/119 |
| 6,011,267 A * | 1/2000 | Kubiak et al. ............ 250/423 P |
| 6,324,256 B1 * | 11/2001 | McGregor et al. .......... 378/119 |
| 6,353,232 B2 * | 3/2002 | Haas et al. ............... 250/492.2 |
| 6,377,651 B1 * | 4/2002 | Richardson et al. .......... 378/34 |
| 6,479,830 B1 * | 11/2002 | Fornaca et al. ......... 250/492.21 |
| 6,504,903 B1 * | 1/2003 | Kondo et al. ................ 378/119 |
| 6,507,641 B1 * | 1/2003 | Kondo et al. ................ 378/119 |

FOREIGN PATENT DOCUMENTS

| | | |
|---|---|---|
| EP | 0 858 249 | 8/1998 |
| JP | 58 066296 | 4/1993 |
| WO | 97 40650 | 10/1997 |
| WO | 99 51357 | 10/1999 |

* cited by examiner

*Primary Examiner*—Drew A. Dunn
*Assistant Examiner*—Allen C. Ho
(74) *Attorney, Agent, or Firm*—Oblon, Spivak, McClelland, Maier & Neustadt, P.C.

(57) ABSTRACT

Process and device for the generation of a fog of micrometric and submicrometric droplets, which may find application to the generation of light in the extreme ultraviolet range, particularly for lithography. According to the process and device, a pressurized liquid is injected into a very small diameter nozzle opening up into a vacuum. Light is generated by focusing laser radiation onto the fog.

12 Claims, 3 Drawing Sheets

PRODUCTION OF A DENSE MIST OF MICROMETRIC DROPLETS IN PARTICULAR FOR EXTREME UV LITHOGRAPHY

TECHNICAL FIELD

This invention relates to a process and a device for the generation of a dense fog of micrometric and submicrometric droplets.

In particularly, it is applicable to the generation of extreme ultraviolet radiation also called "EUV radiation".

It is radiation with a wave length within the range between 8 and 25 nanometers.

The EUV radiation produced according to this invention has many applications, particularly in science of materials, microscopy and particularly lithography, to make integrated circuits with a very large scale integration (VLSI).

Other applications include the surface deposition of aggregates, for which large and hot aggregates are more suitable than small and cold aggregates generated by all devices according to prior art.

STATE OF PRIOR ART

Many techniques are known for the production of EUV radiation, for example techniques consisting of using a laser beam to irradiate a target placed in a vacuum.

When the illumination from the laser beam is sufficiently intense, the target is strongly ionised. A plasma is thus created in which a number of particles, excited and/or ionised by the electromagnetic field resulting from the laser beam and collisions with other plasma particles are de-excited or recombined while emitting light in the extreme ultraviolet. Thus, a sort of frequency conversion takes place in the heart of the target.

Several types of targets are known that can give a high frequency conversion efficiency capable of producing the most intense possible EUV light.

In particular, for the lithography of integrated circuits, it is necessary to find a target, that can be irradiated by a laser for the production of light in the extreme ultraviolet and that is compatible with the use of lithography for industrial applications. This type of target must satisfy the following requirements:

Debris caused by interaction between the target and the laser beam must be minimised in order to avoid damaging the very expensive optics of the lithography apparatus.

It must be possible to supply the material from which the target is made continuously or in pulsed mode at high frequency, for example of the order of 1 kHz. Therefore, this material must be continuously renewable.

Since the laser is focused on the target, the quantity of irradiated material must be sufficiently high to enable intense emission in the extreme ultraviolet. This imposes two conditions on the target. Firstly, the dimensions of this target must not be too small. Secondly, the average density of the target must be sufficiently large.

The target must be placed in a vacuum, in an area in which the pressure is for example of the order of $10^{-2}$ Pa. The pumping means used to give this pressure must be free of vibrations.

The energy transfer between the laser and the target must be efficient to guarantee a high conversion efficiency.

The target generation device must be reliable in the long term. In particular, the interaction between the laser and the target must take place at a sufficiently large distance from this device to prevent premature wear in the device by the impact of ions ejected from the plasma. This leads to the generation of solid debris originating from erosion of the nozzle.

Generation of EUV radiation by irradiation of a dense jet of xenon aggregates onto which a beam emitted by a nanosecond laser is focused, is divulged in document [1] which, like the other documents mentioned later, is mentioned at the end of this description.

Note that these xenon aggregates are submicrometric grains and they are obtained by condensation of xenon during adiabatic expansion through a nozzle in a vacuum chamber.

Irradiation of these aggregates by a laser beam in the near infrared or the near ultraviolet produces a plasma that emits higher energy light located in the extreme ultraviolet. Coupling between the laser and the target, and therefore the efficiency of this conversion process, are particularly important in the case of irradiation of a jet of xenon aggregates.

A large amount of the laser light is thus absorbed, which encourages creation of a plasma by heating of the aggregates. This efficiency of the conversion process is due to the very small dimensions of the aggregates (smaller than 0.1 $\mu$m) which encourages almost complete penetration of laser light into each aggregate.

Furthermore, the local density of atoms in each aggregate is very high, such that a large number of atoms participate. Furthermore, the large number of aggregates comprising a sufficiently high average number of atoms within the laser beam focusing area results in a very strong emission in the extreme ultraviolet.

Another advantage of an EUV radiation source based on irradiation of a jet of aggregates by a nanosecond laser lies in the almost complete lack of material debris, in other words fast material fragments emitted by the irradiated jet, since these debris could damage the EUV radiation collection optics.

However, large quantities of material debris can be produced by erosion of the nozzle when it is placed too close to the illuminated area. Thus, the information given in documents [1] and [7] divulges that the illuminated area should be placed at a small distance from the nozzle (1 to 2 mm), which causes the generation of large quantities of debris due to erosion of the nozzle.

The use of a jet that forms a renewable target makes it possible to work at a high frequency (of the order of 1 kHz or more), which is suitable for lithography apparatus for the manufacture of very large scale integrated (VLSI) circuits.

The use of xenon as the aggregation gas gives the best results for the emission of extreme ultraviolet since xenon is the gas (a) which gives one of the highest degrees of condensation and thus generates a sufficiently high average size for the aggregates and (b) which has a large number of emission rays within the spectral range considered.

Furthermore, the interaction area between the laser beam and the aggregates jet is small, so that a maximum amount of EUV radiation can be condensed while minimizing optical aberrations.

However, the EUV radiation source that is divulged in document [1], has a number of disadvantages:

The expansion nozzle has to be strongly cooled, which requires significant cryogenic means, The reliability of the aggregates generation device when the nozzle is cooled is reduced by the presence of a large temperature gradient between the cooled end of the nozzle and the movement mechanism of the pulsed valve at which local temperature rises occur.

Operation at high frequency (of the order of 1 kHz) requires high gas flows and consequently very powerful pumping means that could induce vibrations harmful to the alignment of the optics for a lithography apparatus comprising the aggregate generation device.

In the case of xenon, gas recovery means are necessary to minimise costs that could become prohibitive at an industrial scale.

The EUV radiation generation process must only occur within a small area with a diameter smaller than 1 mm. Consequently, all that is actually used is a small quantity of gas inside the jet. However according to document [1], FIG. 5 and document [7], FIG. 5, the density of aggregates decreases sharply when the distance from the nozzle increases. This is why excitation by the laser beam must take place in the immediate vicinity of the nozzle which causes severe erosion of this nozzle (which is usually metallic) by the impact of ions output from the plasma. Erosion of the nozzle significantly reduces its life and therefore the reliability of the EUV radiation source and generates large quantities of debris that could deteriorate the optics and the mask of the lithography apparatus.

Document [2] divulges an EUV radiation source that uses a jet of ice micro-crystals as the target. This consists of a sequence of micro-crystals at a very high repetition frequency in which each micro-crystal typically has a diameter of several tens of micrometers.

These micro-crystals are too large for penetration of the excitation laser beam to be complete, unlike what happens with xenon aggregates. A reduction of the diameter of each micro-crystal would improve penetration, but the efficiency would drop because the number of EUV photon emitters in the plasma would-be reduced.

Therefore, the technique described in document [2] does not satisfy the criteria for obtaining a sufficiently intense EUV radiation source.

Document [3] describes another EUV radiation source based on irradiation of a continuous micro-jet of liquid nitrogen. This type of target also has the disadvantage that it does not contain enough material to have a sufficiently large number of potential EUV emitters. This is due to the relatively small diameter (about 10 $\mu$m) of the liquid nitrogen jet.

Furthermore, the sources described in documents [2] and [3] are not very stable in terms of intensity. In the case described in document [2], it is difficult to irradiate each ice micro-crystal in the same manner due to a problem of synchronisation with the laser. In the case described in document [3], variations of the EUV intensity are due to instabilities of the continuous nitrogen jet.

Document [4] also describes an EUV radiation source based on irradiation of a gas jet that entrains micro particles, for example metallic micro particles. This known technique has good EUV radiation emission stability, like the technique using jets of xenon aggregates, but with a much lower particle density. The result is a significantly lower production of EUV radiation.

Furthermore, the carrier gas does not directly participate in generation of the EUV radiation. Therefore, there is a large content of superfluous gas at high frequency that has to be pumped, which causes vibrations as in the case of jets of xenon aggregates.

Documents [5] and [6] are also mentioned related to the emission of X-rays by aggregates, for example krypton, xenon or argon aggregates.

PRESENTATION OF THE INVENTION

This invention divulges a technique for the generation of EUV radiation that has almost all the advantages of known techniques mentioned above, without the disadvantages of these known techniques.

The invention does this using a target consisting of dense fog of micrometric and submicrometric liquid droplets. The conversion efficiency of this target is greater than or similar to the conversion efficiency obtained with known techniques in the EUV field.

More generally, this invention relates to a process and a device for the generation of a dense fog of liquid droplets, this process and this device being useable particularly for the production of EUV radiation and is also very reliable and very simple, which is essential for industrial use.

More specifically, the purpose of this invention is a process for generation of a fog composed of liquid droplets, this process being characterised in that the liquid is pressurised at a pressure of the order of $5 \times 10^5$ Pa to $10^7$ Pa and the liquid thus pressurised is injected into a nozzle that has a diameter varying between 20 $\mu$m and 1 mm, this nozzle opening out into an area in which the pressure is less than or equal to $10^{-2}$ Pa, and a dense fog of liquid droplets is thus generated at the exit from the nozzle, the sizes of the droplets being of the order of 10 $\mu$m to 30 $\mu$m, this dense fog being located approximately along the centre line of the nozzle. The average fog density is greater than or equal to $10^{20}$ molecules/cm$^3$.

According to the preferred embodiment of the process according to the invention, the nozzle is heated. Generation of the dense fog absorbs calories that usually have to be compensated by the input of heat. This input of calories is lower if the liquid being used is cryogenic (liquefied gas).

Furthermore, it is advantageous to input a quantity of heat at the nozzle greater than the heat absorbed by generation of the dense fog, to improve the uniformity of the liquid droplets.

A laser beam can also be focused on the dense fog thus obtained, this laser beam being capable of interacting with this dense fog to generate light in the extreme ultraviolet range.

Advantageously, the laser beam is focused on the dense fog at a distance from the nozzle of the order of 1 mm to 10 mm.

Nevertheless, a larger distance up to several centimetres could be used without departing from the scope of the invention.

Light generated in the extreme ultraviolet range can be used for insolation of a substrate on which a photoresist layer is deposited.

Another purpose of this invention is a device for generation of a fog composed of liquid droplets, this device being characterized in that it comprises:

a reservoir that will contain the liquid, means of pressurisation of the liquid contained in the reservoir, by subjecting it to a pressure of the order of $5 \times 10^5$ Pa to $10^7$ Pa, a nozzle, the diameter of which is between 20 $\mu$m and 1 mm and that is connected to the reservoir, a vacuum chamber containing the nozzle, and pumping means to set up a pressure equal to or less than about $10^{-2}$ Pa in this vacuum chamber, to thus generate a dense fog of liquid droplets in the vacuum chamber at the exit from the nozzle, with sizes of the order of 10 μm to 30 μm, this dense fog being located approximately on the centre line of the nozzle.

According to one particular embodiment of the device according to the invention, this device also comprises means of heating the nozzle.

For example, the pressurisation means comprise means of injecting a pressurised gas in the reservoir.

According to one particular embodiment of the invention, the nozzle is provided with pulsing means to produce the dense fog in pulsed form.

In particular, the device according to the invention can be used with water as the liquid.

This invention also relates to a light source in the extreme ultraviolet range, this source comprising:

the fog generation device according to the invention, means of generating a laser beam that can interact with the dense fog generated using the device, and means of focusing the laser beam on this dense fog.

This invention also relates to lithography apparatus for semi conducting substrates, this apparatus comprising:

means of support for a semi conducting substrate on which a photoresist layer is deposited that will be insolated according to a determined pattern, a mask comprising the determined pattern in enlarged form, a light source in the extreme ultraviolet range, optical means for transmission of light to the mask, the mask supplying an image of the pattern in enlarged form, and optical means for reducing this image and projecting the reduced image on the photoresist layer, and the source in this apparatus is conform with the light source according to the invention.

BRIEF DESCRIPTION OF THE DRAWINGS

This invention will be better understood after reading the description of example embodiments given below, for illustrative purposes only and in no way restrictive, with reference to the appended drawings in which.

DETAILED PRESENTATION OF PARTICULAR EMBODIMENTS

Figure 1:
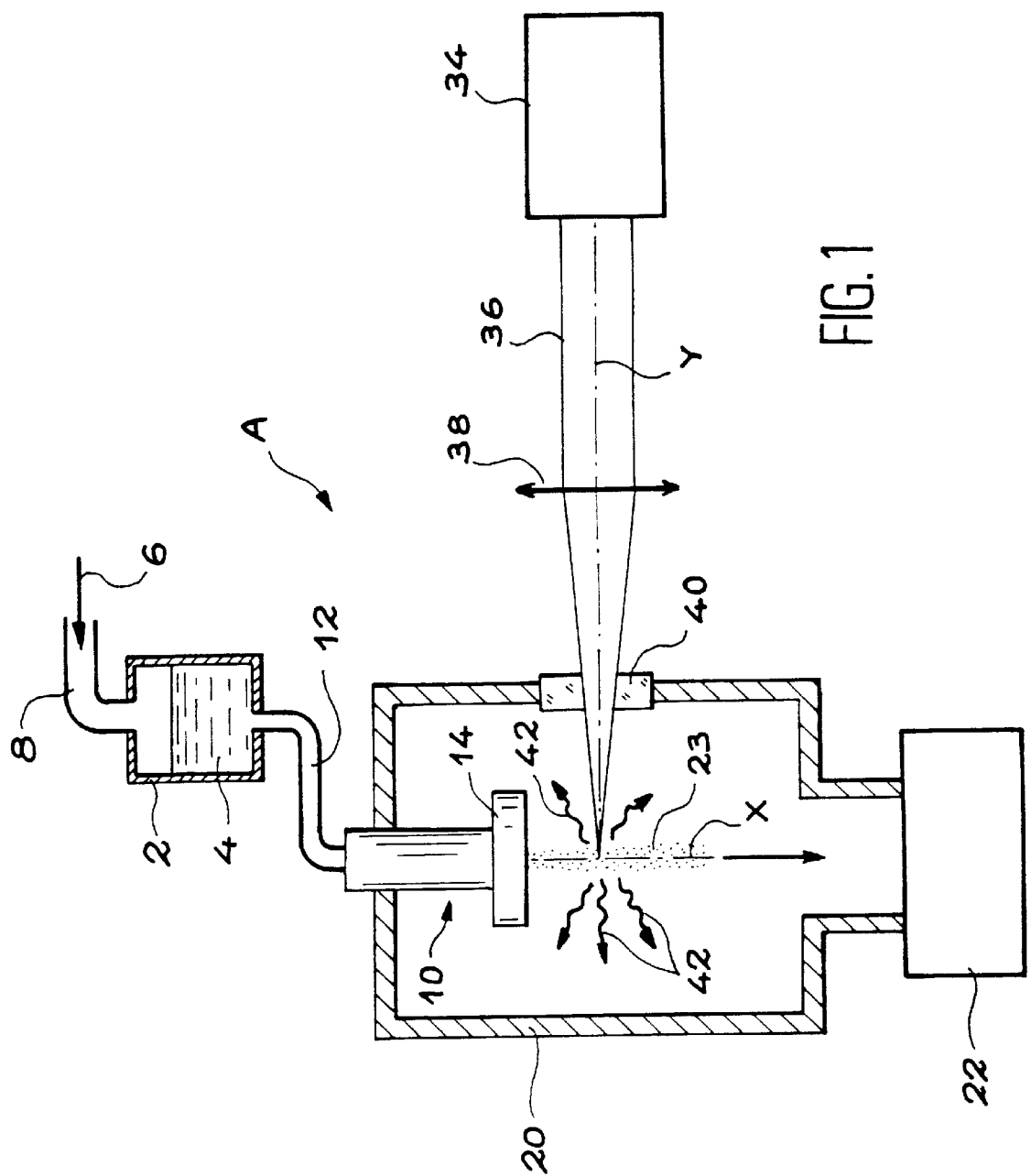
FIG. 1 is a diagrammatic view of a particular embodiment of the device for generation of a dense fog of droplets according to the invention.
Figure 2:
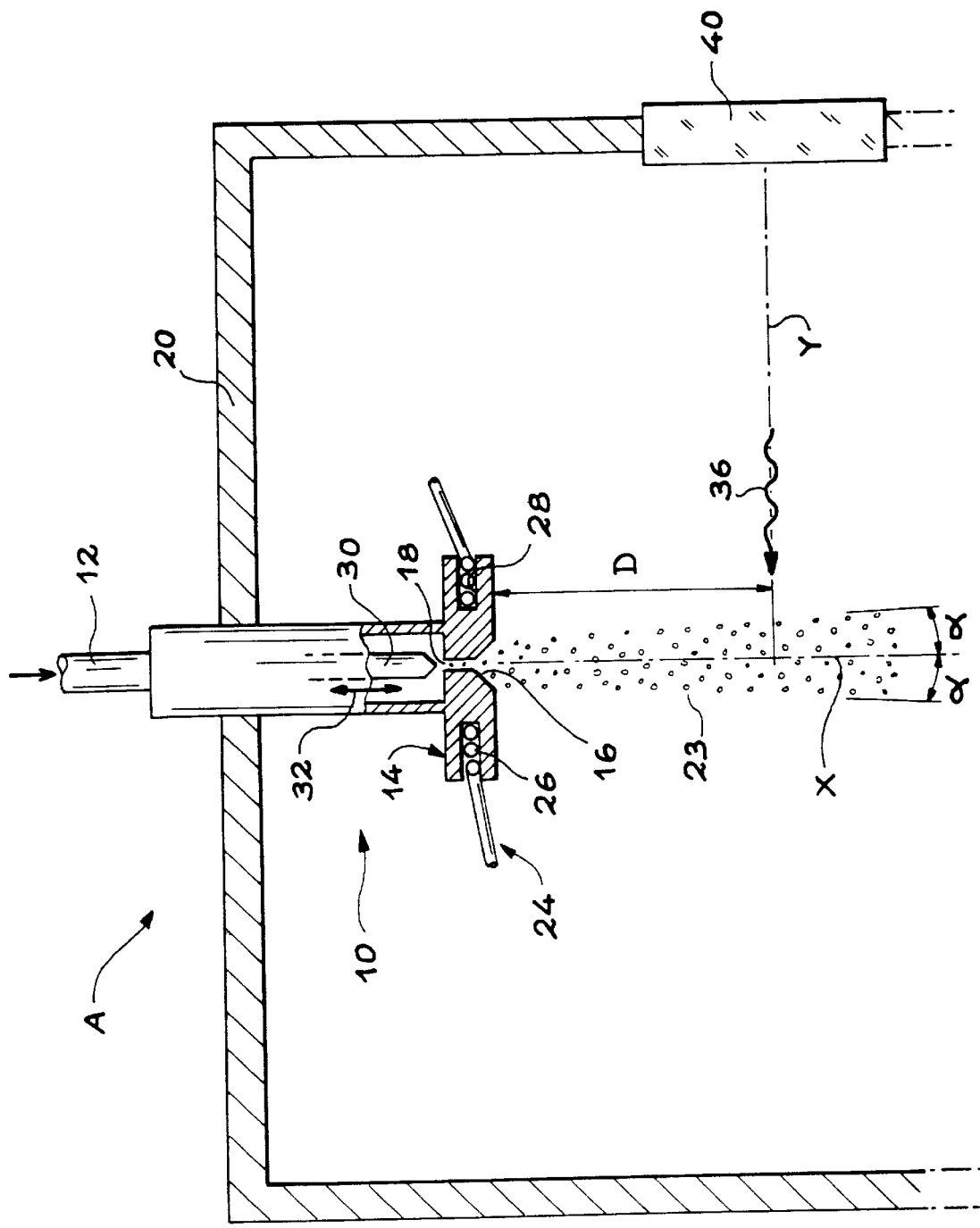
FIG. 2 is a diagrammatic view of the nozzle that forms part of the device in FIG. 1.

The fog generation device A according to the invention that is shown diagrammatically in FIG. 1, and part of which is shown diagrammatically in FIG. 2 comprises a reservoir 2 that is designed to contain a liquid 4 that will be used to generate a dense fog of micrometric and submicrometric droplets.

The device A also comprises means of pressurization of the liquid 4 contained in the reservoir 2. These pressurization means are symbolized by the arrow 6 in FIG. 1 and, in the example shown, are designed to send a pressurized gas into the reservoir.

This pressurized gas, derived from means not shown, is an inert gas for example such as air, nitrogen or argon.

The pressure in this gas that is applied to the liquid is equal to $5\times10^5$ Pa to $10^7$ Pa.

The pressurized gas is directed to the upper part of reservoir 2 through a pipe 8.

The device A conform with the invention also comprises a nozzle 10 that leads to the bottom of the reservoir 2 through a pipe 12. For example, this nozzle is made of metal, ceramic or quartz.

FIGS. 1 and 2 show the nozzle 10 oriented vertically, but any other orientation would be possible depending on the needs, for example it could be oriented horizontally.

A hole 16 is formed in the lower part 14 of the nozzle 10, which may have a cylindrical, conical or exponential shape.

The diameter of the upper end 18 of this hole 16 is between 20 μm and 1 mm. This diameter is called the "nozzle diameter".

The nozzle 10 opens up into a vacuum chamber 20. This vacuum chamber 20 is provided with pumping means 22 capable of creating a pressure equal to about $10^{-2}$ Pa.

The liquid, for example water, that is inlet into nozzle 10 is thus expelled violently through the hole 16 in this nozzle into the vacuum chamber 20 and forms a high density mist 23, or a dense fog of micrometric and submicrometric liquid particles in this vacuum chamber.

The diameters of these droplets are of the order of 10 μm to 30 μm.

The mist 23 is strongly confined along the centre line X of the nozzle which is also the centre line of the hole 16 in this nozzle.

In the device according to the invention shown in FIGS. 1 and 2, no cooling of the nozzle 10 is necessary to obtain the dense and highly directional fog 23.

However, it is preferable to provide nozzle heating means 24. In the example shown in FIG. 2, these heating means 24 comprise a heating strip 26 that is wound in a circular groove 28 that has its axis along the centre line X and that is formed on the lower part 14 of the nozzle 10.

Means not shown are provided to create an electrical current circulating in this heating strip 26.

This heating of the nozzle 10 can improve the uniformity of the liquid droplets formed, apart from compensation of heat absorbed by the liquid during formation of the dense fog. In particular, this better uniformity improves the interaction efficiency between a laser beam and the droplets in the particular dense fog application that will be considered later and is related to the generation of EUV radiation using this type of interaction.

For example, heating means 24 may be used to heat the nozzle 10 to temperatures equal to or less than 300° C.

The size of the liquid droplets contained in the dense fog 23 depends on the temperature of the nozzle 10 and the geometric parameters of this nozzle (particularly the shape of the hole 16 in the nozzle).

These parameters must be optimised as a function of the properties of the liquid used, for example the viscosity, the vapour pressure and the boiling point of this liquid.

If water is used, it is preferable to use a reservoir 2 and a pipe 12 made of aluminium or stainless steel or coated with Teflon (Trade mark) on the inside, in order to prevent internal corrosion of this reservoir and this pipe.

A dense continuous fog of liquid droplets, or a pulsed fog, can be formed.

For example, this type of pulsed fog can be formed by providing a piston 30 inside the nozzle 10, the end of the piston 30 being pointed and designed to periodically close off the hole 16, and means symbolised by the arrow 32 in FIG. 2, that can be made by an expert in the subject and designed to make the piston 30 oscillate along the centre line X of the nozzle.

For example, these oscillation means may be electromagnetic or piezoelectric.

For example, the pulse frequency of piston 30 may be of the order of 20 Hz, but it may be increased to 1 kHz using techniques known to an expert in the subject.

The fog 23 of micrometric or submicrometric droplets is very similar to a jet of very large aggregates, but has a much more pronounced directivity.

In the case of water, the half divergence angle a (FIG. 2) of the fog 23 is of the order of 1°.

For an application of the invention to the generation of EUV radiation, it then becomes possible to make the excitation laser beam interact at a distance D from the nozzle 10 and thus prevent erosion of this nozzle by the plasma resulting from the interaction between the liquid (water) and the laser beam.

This distance D is shown in FIG. 2. It is the distance between the lower end 14 of the nozzle 10 and the centre line Y of the laser beam focused on the dense fog 23.

The distance D may be adjusted between 2 mm and 10 mm.

Furthermore, the liquid droplets injected into the vacuum chamber 20 may pass almost entirely through the laser beam focusing area, thus considerably reducing the quantity of material that does not participate in the generation of EUV radiation.

The strong confinement of the fog 23 of water droplets also enables the use of cryogenic type pumping means 22.

Note that these pumping means communicate with the inside of the vacuum chamber 20 through an opening located facing the lower end 14 of the nozzle 10 and through which the centre line X (geometric) passes.

Cryogenic pumping means are inexpensive and very efficient, and do not generate any vibrations.

The ice formed can then be eliminated from the vacuum chamber 20 by various methods, for example using a device (not shown) consisting of an airlock in order to obtain uninterrupted operation of the device.

We will now consider an application of the dense fog 23 of liquid droplets to the generation of an EUV radiation.

This fog 23 is excited using a laser irradiation of the type described in document [1].

For example a nanosecond laser 34 of the Nd:YAG or excimer type is used with a pulse duration between 0.1 nanosecond and 100 nanoseconds and an energy per pulse greater than 10 mJ.

The beam 36 supplied by the laser 34 is focused using a lens 38 or a mirror, onto the fog 23 in order to obtain a laser illumination on this fog between $10^{10}$ W/cm$^2$ and $10^{14}$ W/cm$^2$.

Note that in the example shown, the laser beam 36 is brought into the vacuum chamber 20 through a port 40 transparent to this laser beam and mounted on a wall of the vacuum chamber.

In FIG. 1, the intense EUV radiation emitted by the liquid droplets is symbolised by the arrows 42 oriented in all directions. However, the largest quantity of EUV light is produced by the plasma half-sphere facing the laser beam.

One or several ports (not shown) are provided on one or several walls of the chamber 20 to retrieve EUV radiation and to use it.

For the application of EUV radiation to nanolithography, it is preferable if the wave length of the EUV radiation emitted by the fog 23 is within the range of between 10 and 14 nanometers, which is the optimum range of wave lengths of reflective optics provided for this nanolithography.

For example, such wave lengths can be obtained using water as the liquid to generate radiation of the $0^{5+}1s^22p^-1s^24d$ oxygen transition (located at 13 nm)

Note that water has the advantage that it is inexpensive. Unlike xenon, it does not require any recycling device.

However, it is possible to use other liquids, liquid mixes or solutions, in order to optimise the generation of EUV radiation between 10 and 14 nanometers or close to another wave length if this becomes necessary.

The dense fog of micrometric of submicrometric liquid droplets obtained in a vacuum according to the invention has the advantages of a jet of xenon aggregates (fog-laser coupling causing absorption rates close to 1 and no solid debris that could degrade the EUV radiation treatment optics).

But the device used to generate this dense fog is simpler and more reliable than the device used to generate xenon aggregates.

In principle, it would be possible to produce a jet of water aggregates according to document [1], but the technique for production of this jet would be complex since the water would have to be gasified and it would have to be kept in the gaseous state until adiabatic expansion occurs through a nozzle.

Furthermore, cryogenic cooling of the nozzle as in the case of xenon would have to be used to produce large aggregates. The production of sufficiently large water aggregates using this technique would be extremely difficult.

Figure 3:
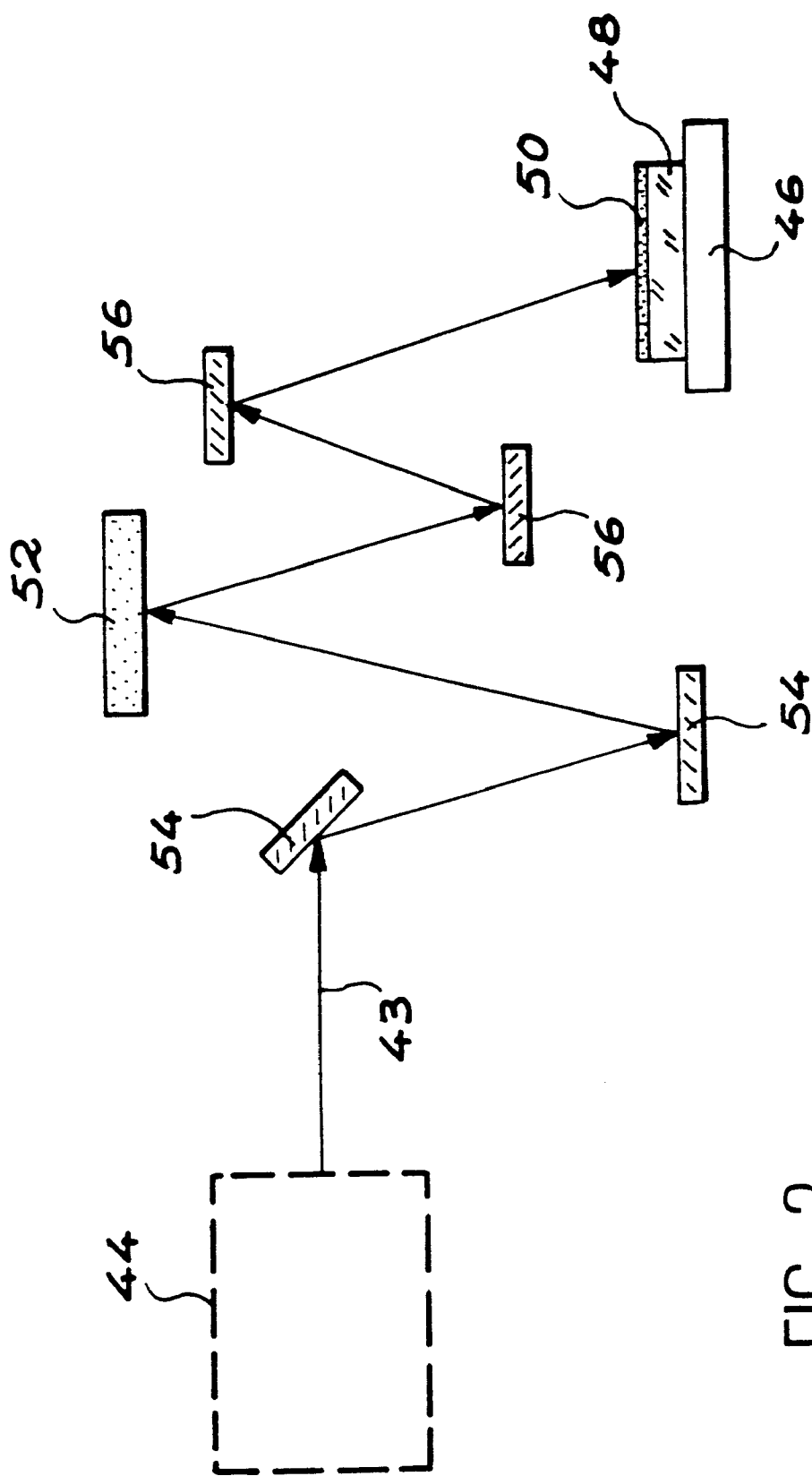
FIG. 3 is a diagrammatic view of a lithography apparatus according to the invention.

FIG. 3 very diagrammatically illustrates the use of EUV radiation obtained with a device according to the invention for nanolithography.

The nanolithography apparatus diagrammatically illustrated in this FIG. 3 comprises a device 44 for the generation of EUV radiation of the same type as the EUV radiation source described with reference to FIG. 1.

The nanolithography apparatus according to FIG. 3 also comprises a support 46 for the semi conducting substrate 48 to be treated and that is covered with a photoresist layer 50 that will be insolated according to a determined pattern.

The apparatus also comprises:
- a mask 52 including this pattern in enlarged form,
- optics 54 designed to format EUV radiation reference 43 output from device 44, and carry this radiation 43 to the mask 52 that then supplies an image of the pattern in enlarged form, and
- optics 56 designed to reduce this enlarged image and project the reduced image onto the photo resist layer 50.

The support 46, the mask 52 and optics 54 and 56 are located in a vacuum chamber not shown which, for simplification reasons, is preferably the vacuum chamber in which the EUV insolation radiation 43 is created.

The following documents are referred to in this description:

[1] Kubiak et al., "Cluster beam targets for laser plasma extreme ultraviolet and soft X-ray sources", U.S. Pat. No. 5,577,092 A,

[2] Richardson et al., "Water laser plasma X-ray point sources", U.S. Pat. No. 5,577,091 A

[3] Hertz et al., "Method and apparatus for generating X-ray or EUV radiation" international application PCT/SE97/00697 Apr. 25, 1997

[4] Matsui et al., "Laser plasma X-ray source, and semiconductor lithography apparatus and method using the same", EP 0858249 A

[5] McPherson et al., "Multiphoton-induced X-ray emission and amplification from clusters", Applied Physics B57, 667–347 (1993)

[6] McPherson et al., "Multiphoton-induced X-ray emission from Kr Clusters on M-Shell (−100Δ) and L-Shell (~6Δ) transitions" Physical review letters vol. 72 No. 12 (1994), p.1810 to 1813

[7] Kubiak et al., "Scale-up of a cluster jet laser plasma source for extreme ultraviolet Lithography", SPIE Conference on Emerging Lithographic Technologies III, March 1999, P. 669 to 678.

What is claimed is:

1. Process for generation of a fog composed of droplets of a liquid, comprising:

pressurizing the liquid at a pressure of an order of $5\times10^5$ Pa to $10^7$ Pa; and injecting the liquid thus pressurized into a nozzle with a diameter of between 20 μm and 1 mm, the nozzle opening up into an area in which the pressure is equal to or less than $10^{-2}$ Pa and thus generates a fog of liquid droplets with sizes of an order of 10 μm to 30 μm at an area at an exit from the nozzle, an average fog density being greater than or equal to $10^{20}$ molecules/cm$^3$, the fog being strongly confined on a center line of the nozzle.

2. Process according to claim 1, wherein the nozzle is heated.

3. Process according to claim 1, further comprising focusing a laser beam on the fog, the laser beam configured to interact with the fog to generate light in an extreme ultraviolet range.

4. Process according to claim 3, wherein the laser beam is focused on the fog at a distance of an order of 1 mm to 10 mm from the nozzle.

5. Process to claim 3, wherein the light generated in the extreme ultraviolet range is used for insolation of a substrate on which a photoresist layer is deposited.

6. Device for generating a fog composed of droplets of a liquid, the device comprising:

a reservoir configured to contain the liquid;

means for pressurizing the liquid contained in the reservoir, by subjecting the liquid to a pressure of an order of $5\times10^5$ Pa to $10^7$ Pa;

a nozzle having a diameter between 20 μm and 1 mm and connected to the reservoir;

a vacuum chamber containing the nozzle; and pumping means for setting up a pressure less than or equal to about $10^{-2}$ Pa in the vacuum chamber, to thus generate a fog of liquid droplets in the vacuum chamber at an exit from the nozzle, with sizes of an order of 10 μm to 30 μm, an average fog density being greater than or equal to $10^{20}$ molecules/cm$^3$, the fog being strongly confined on a center line of the nozzle.

7. Device according to claim 6, further comprising means for heating the nozzle.

8. Device according to claim 6, wherein the means for pressurizing includes means for injecting a pressurized gas into the reservoir.

9. Device according to claim 6, wherein the nozzle includes a pulsing means for producing the fog in pulsed form.

10. Device according to claim 6, wherein the liquid is water.

11. Light source in an extreme ultraviolet range, comprising:

the device according to claim 6, means for generating a laser beam configured to interact with the fog generated using the device; and means for focusing the laser beam on the fog.

12. Lithography apparatus for semiconducting substrates, comprising:

means for supporting a semiconducting substrate on which a photoresist layer is deposited that will be insulated according to a determined pattern;

a mask comprising the determined pattern in enlarged form;

a light source in an extreme ultraviolet range;

optical means for transmitting light to the mask, the mask supplying an image of the pattern in enlarged form; and optical means for reducing the image and projecting the reduced image on the photoresist layer, wherein the light source in this apparatus is according to claim 11.

* * * * *